United States Patent [19]
Saito et al.

[11] Patent Number: 5,804,495
[45] Date of Patent: Sep. 8, 1998

[54] METHOD OF MAKING SOI STRUCTURE

[75] Inventors: Yuichi Saito; Kenichi Kawai, both of Tokyo, Japan

[73] Assignees: Mitsubishi Materials Corporation; Mitsubishi Materials Silicon Corporation, both of Tokyo, Japan

[21] Appl. No.: 369,251

[22] Filed: Jan. 5, 1995

Related U.S. Application Data

[62] Division of Ser. No. 111,434, Aug. 25, 1993, abandoned, which is a continuation of Ser. No. 688,321, Apr. 22, 1991, abandoned.

[30] Foreign Application Priority Data

Apr. 24, 1990 [JP] Japan .................................. 2-108300

[51] Int. Cl.$^6$ .................................................. H01L 21/76
[52] U.S. Cl. ......................................... 438/459; 438/406
[58] Field of Search .............................. 357/49; 437/62, 437/90, 67, 974, 225, 249; 148/DIG. 12, DIG. 135, 33.2

[56] References Cited

U.S. PATENT DOCUMENTS

| | | |
|---|---|---|
| 3,393,349 | 7/1968 | Huffman . |
| 3,797,102 | 3/1974 | Huffman . |
| 4,017,341 | 4/1977 | Suzuki et al. . |
| 4,567,646 | 2/1986 | Ishikawa et al. . |
| 4,851,078 | 7/1989 | Short et al. ................ 437/62 |
| 4,857,387 | 8/1989 | Eberhardt et al. . |
| 4,962,056 | 10/1990 | Yamaki et al. ............. 437/62 |
| 5,051,378 | 9/1991 | Yagi et al. . |
| 5,091,330 | 2/1992 | Cambou et al. ............ 437/62 |
| 5,096,854 | 3/1992 | Saito et al. ................ 437/225 |
| 5,420,064 | 5/1995 | Okonogi et al. ............. 437/62 |

FOREIGN PATENT DOCUMENTS

| | | |
|---|---|---|
| 0145573 | 6/1985 | European Pat. Off. . |
| 0213299 | 3/1987 | European Pat. Off. . |
| 0267862 | 5/1988 | European Pat. Off. . |
| 0268859 | 6/1988 | European Pat. Off. . |
| 1514196 | 4/1969 | Germany . |
| 59-057450 | 4/1984 | Japan . |
| 59-080940 | 5/1984 | Japan . |
| 59-104139 | 6/1984 | Japan . |
| 61-090443 | 5/1986 | Japan . |
| 2-28925 | 1/1990 | Japan . |
| 2100508 | 12/1982 | United Kingdom . |

OTHER PUBLICATIONS

Japanese Journal of Applied Physics, Silicon–on–Insulator Wafter Bonding–Wafer Thinning Technology Evaluations, Aug. 1989, No. 8, Part 1, pp. 1426–1443.

Journal of the Electrochemical Society (1986) Aug., No. 8, Manchester, NH, USA, A Field–Assisted Bonding Process for Silicon Dielectric Isolation, pp. 1673–1677.

English abstracts of Japanese Appln. No. 59–057450 filed Apr. 1984; Japanese Appln. No. 59–080940 filed May 1984; Japanese Appln. No. 59–104139 filed Jun. 1984; Japanese Appln. No. 61–090443 filed May 1986.

*Primary Examiner*—John Niebling
*Assistant Examiner*—S. Mulpuri
*Attorney, Agent, or Firm*—Cushman Darby & Cushman IP Group of Pillsbury Madison & Sutro LLP

[57] ABSTRACT

A silicon wafer for the volume production of integrated circuit devices has a lattice network of chip separating structure containing a plurality of rectangular-shaped cavities which is filled completely with silicon single crystals to form single crystal layer sections of the same height as the depth of the lattice network. Both the cavities and the single crystal layer sections are dimensioned to suit the planar dimensions of an integrated circuit device chip to be used for volume production.

5 Claims, 2 Drawing Sheets

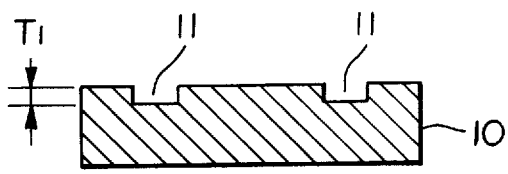
FIG.3
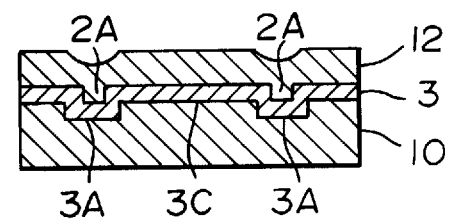
FIG.4
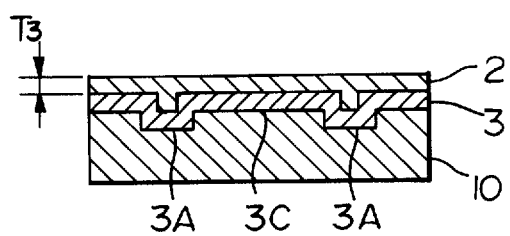
FIG.5
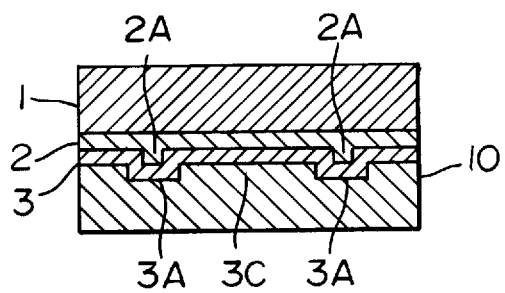
FIG.6
FIG.7
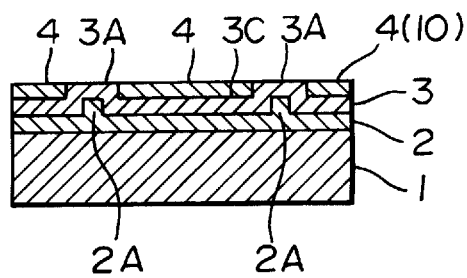
FIG.8

METHOD OF MAKING SOI STRUCTURE

This is a division of application Ser. No. 08/111,434, filed on Aug. 25, 1993, which was abandoned upon the filing hereof which is a Continuation of Ser. No. 07/688,321 filed Apr. 22, 1991, abandoned.

BACKGROUND OF THE INVENTION

1. Field of the Invention

This invention relates to silicon wafers for integrated circuit fabrication. The wafer has a plurality of electrically isolated single crystal layer sections, for fabricating integrated circuits therein, disposed on top of the insulating surface formed on the silicon wafer base.

2. Description of the Related Art

Commercial silicon wafers generally available today are manufactured by thinly slicing a single crystal ingot of silicon into thin wafers and polishing one of the two wafer surfaces to a mirror finish.

The IC and LSI (hereinafter grouped together as IC) circuits are fabricated on this polished surface and are then separated into a plurality of components at the scribing lines between the circuits.

The need for higher device performance has created a trend toward a different IC architecture called Silicon On Insulator (SOI). The SOI IC circuits are not prone to soft errors and latch-up phenomenon and are characterized by their high speed performance. Of the many known SOI production techniques such as bonded wafer method, SIMOX (separation by implanted oxygen), FIPOS (full isolation by oxidized silicon), laser recrystallization method, and lateral epitaxial method, the bonded wafer method is the most reliable.

This production technique is explained in the following.

First, two polished silicon wafers are prepared, one of which wafers is treated by chemical vapor deposition (CVD) to form $SiO_2$ insulation on its surface and this wafer is further CVD treated to form polycrystalline silicon on its surface. The treated wafer and the untreated wafer are then washed in an alkaline solution, to form a film of OH on the surfaces. Next, the polished surface of the untreated wafer is pressed against the surface of the CVD treated wafer and the two wafers are tacked together at 200° C. under pressure, and are then finally diffusion bonded at 1000° C. in a semiconductor furnace to produce a bonded interface. The unbonded surface of the latter wafer is then ground and polished, leaving a single crystal layer of thickness in the range of several angstroms to several micrometers, to produce a bonded wafer.

On the polished surface of the above bonded wafer are fabricated transistor elements. In the case of DRAMs, an element consists of a transistor and a capacitor. Next, the elements are isolated electrically from each other and can then be interconnected appropriately to form an operable IC circuitry, thus producing commercial SOI-IC devices.

Many IC chips can be produced from a bonded wafer by separating them at the scribing lines between the IC chips. SOI wafers can improve the performance characteristics, for example speed, high-voltage resistance and irradiation effects, of such transistor devices as the field effect transistors.

It should be noted that one of the steps in the above production process, of preparing a single crystal layer of thickness in the range of several angstroms to several micrometers, over the entire surface of the wafer, within 10–20%, is technically a very difficult task. In many cases, the surface becomes slanted.

The inventors of the present invention have disclosed earlier in a Japanese Laid-open Patent Publication No. H2-28925 the following manufacturing method for these SOI bonded wafers.

First, a large number of latticed grooves is formed on the polished surface of a silicon wafer. The lattice spacings are selected, in the range of several microns to several tens of microns, to suit transistor elements.

Next, the surface is oxidized to form a thin chip separating structure of silicon dioxide $SiO_2$ throughout including the inside of the grooves. Polycrystalline silicon are deposited on top of the chip separating structure to fill in the spaces in the grooves completely, and the deposited surface is polished off to obtain a flat surface. This polished polycrystalline silicon layer surface is bonded to the polished surface of a regular wafer as a backing. Grinding and mechano-chemical precision polishing are applied to the bonded wafer from the back side until the latticelike top surface of the chip separating structure becomes just exposed.

However, such conventional SOI manufacturing processes require customized fabrication of a large variety of cell dimensions and shapes on a wafer depending on the type of IC chips needed. Therefore, the existing SOI chip technology is practiced only as an incidental processing step of a conventional IC manufacturing process. Presently, therefore, SOI wafers are not made as a commodity item for IC device manufacturing.

Furthermore, it is difficult to assess the thickness of the silicon layers in such SOI wafers made by the present technology after the completion of the fabrication processing. As a result, it is difficult to detect those reject wafers having non-uniform cell thickness, which leads ultimately to lower productivity of SOI-based devices.

SUMMARY OF THE INVENTION

A silicon wafer for the production of integrated circuit chips comprising:

(a) a disc-shaped wafer body made of silicon;

(b) a chip separating structure formed on said wafer body and having a plurality of rectangular-shaped cavities of a common depth formed therein, said cavities being arranged to provide a lattice (scribe) network;

(c) a plurality of silicon single crystal layer sections each formed on a respective one of said cavities, each single crystal layer section having a surface flush with that portion of said chip separating structure serving as said lattice network, each single crystal layer section having the same planar size as a respective one of said integrated circuit chips.

The invented silicon wafer permits highly efficient volume production of IC chips having a SOI architecture because a plurality of IC circuits can be fabricated on the single crystal layer sections on such a wafer, which can be subsequently separated along the lattice (scribe) network of the chip separating structure. Another advantage of the invented silicon wafer is that such a wafer can be used for production of IC chips with the only restriction that the IC chip dimensions be compatible.

Furthermore, by increasing the planar dimensions of the single crystal layer sections to the levels of the external dimensions of an IC chip, the interference colors produced by the single crystal layer sections become visible. Accordingly, defective wafers can also be recognized easily, thereby improving the yield.

Another productivity advantage of the invented wafers is that because the single crystal layer sections and the lattice network have different coloring, the chip separation operation can be effected speedily by simply aligning the cutter with the lines of the lattice network, which are also used as scribe lines.

Further advantage of the present wafer is that the lattice network and the peripheral regions act together as a mechanical guide unit to control the section thickness during polishing to provide an accurate limit to the thickness of the single crystal layer sections.

BRIEF DESCRIPTION OF THE DRAWINGS

FIGS. 3 to 8 are illustrations of the cross sectional structures of a wafer in the various manufacturing steps involved in the present invention.

DETAILED DESCRIPTION OF THE PREFERRED EMBODIMENTS

Figure 1:
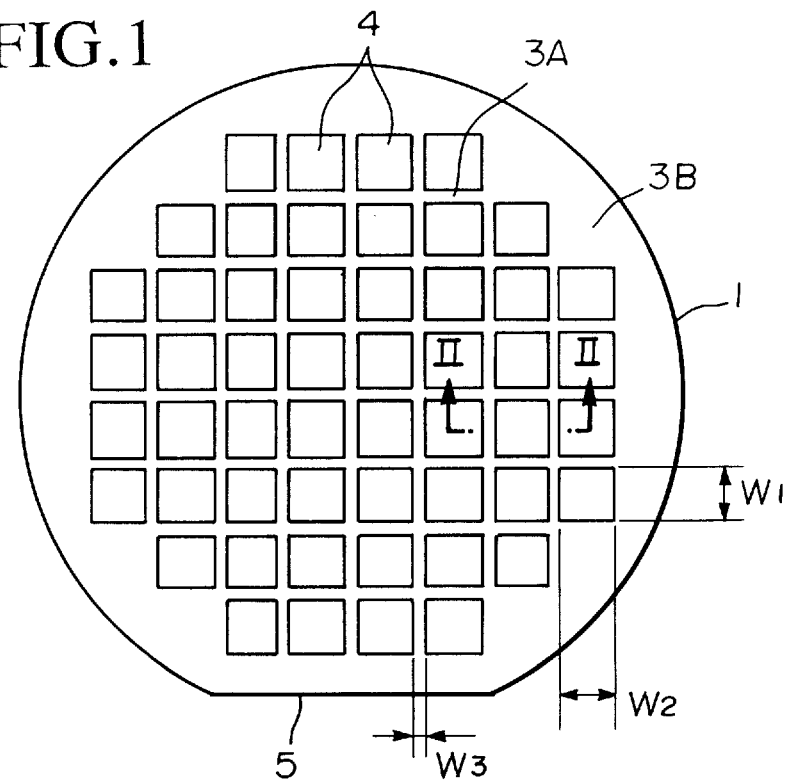
FIG. 1 is a plan view of a SOI wafer in a first preferred embodiment.
Figure 2:
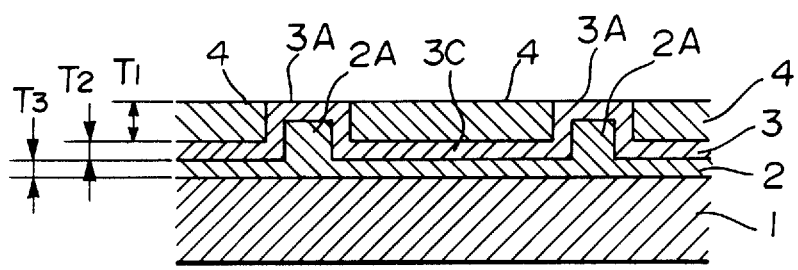
FIG. 2 is an enlarged cross sectional view taken along the line II—II in FIG. 1.

A first preferred embodiment of this invention is explained with reference to FIGS. 1 and 2.

In the figures, the numeral 1 designates a silicon wafer body, having its top surface polished to a mirror finish. On the entire polished surface of the wafer body 1 is formed a polycrystalline silicon layer 2.

An integral latticed protrusion 2A of polycrystalline silicon of a given spacing protrudes from said polycrystalline silicon layer 2, except in the circumferential region of the wafer body. The cross sectional shape of said latticed protrusion 2A is rectangular, and in the circumferential region, the thickness of the polycrystalline silicon layer 2 is the same as that of the latticed protrusion 2A.

On the entire top surface of said polycrystalline silicon layer 2 is formed an insulation layer 3 made of $SiO_2$ of a given thickness, duplicating the contour of the polycrystalline silicon layer 2. Therefore, the latticed protrusion 2A produces corresponding insulating protrusion 3A, which forms an extensive network of lattices, on the insulation layer 3, and is termed the lattice (scribe) network 3A. The peripheral region of the wafer is also formed with a layer of $SiO_2$ insulation, referred to as the circumferential exposed region 3B, of a height equal to that of the lattice network 3A. In this case, the insulation layer 3 (including the lattice network 3A and circumferential exposed region 3B) corresponds to the chip separating structure. Therefore, the spaces are created by these bonding structures, and are referred to as rectangular-shaped cavities 3C.

The thickness $T_2$ of the insulation layer 3, except in the lattice network 3A, is in the range of 0.1 to 2.0 micrometers. If it is less than 0.1 micrometer, there is insufficient electrical insulation while if it exceeds 2.0 micrometers, it is difficult to form the insulation layer 3. The preferred width $W_3$ of each lines in the lattice network 3A is in the range of 0.2 to 2.0 mm. If it is less than 0.2 mm, the lattice network 3A is not effective as stopper widths over 2.0 mm are not desirable because only relatively small areas would then be left for fabrication of active elements on the single crystal layer.

These cavities 3C are filled integrally with single crystal deposits, forming isolated single crystal layer sections 4 (hereinafter referred to as single crystal sections 4). The top surfaces of the single crystal sections 4, of the lattice network 3A and of the circumferential exposed region 3B are all coplanar. The thickness $T_1$ of the single crystal sections 4 ranges from 0.05 to 0.2 micrometer. When this thickness $T_1$ is less than 0.05 micrometer, it is difficult to form the single crystal sections 4, and if this thickness is over 0.2 micrometer, it presents difficulties in IC processing. For example, it becomes difficult to fabricate completely isolated IC elements by selective oxidation.

The external dimensions $W_1$ and $W_2$ of a single crystal sections 4 are the same as the corresponding dimensions of the IC chip concerned or standard chip dimensions. In general, the dimensions of $W_1$ and $W_2$ are in the range of 1 to 20 mm. Also, in this preferred embodiment, one direction of the lattice network 3A is aligned with the orientation notch 5.

To produce IC chips with the SOI architecture, active elements are fabricated within each prefabricated chip area to produce an appropriate IC circuit. Next, single crystal sections 4 are subjected to a selective oxidation step to form insulation barriers to reach insulation layer 3 so as to produce many electrically isolated cells within each of the single crystal layer sections 4. The numerous chips formed in the single crystal sections 4 can be separated by slicing along respective lines of the lattice network 3A, thus producing IC chips, having a SOI architecture, efficiently and economically.

Accordingly, the present invention is applicable to the production of various types of commodity type SOI-IC chips, without regard to the circuit types, with the only restriction that the dimensions of the single crystal sections 4 given by the dimensions $W_1$ and $W_2$ be the same as the external dimensions of the IC chips required.

Another advantage is that because the size of the single crystal layer sections 4 are large, interference colors of the single crystal sections 4 can be recognized easily. This provides an easy and efficient means of identifying and rejecting wafers of non-uniform thickness, which would produce unacceptable ICs. Therefore, the process of making SOI chips from the invented wafers is cost efficient for the overall IC processing, because it is able to minimize the production of rejects.

Another advantage of the wafers is that since the coloring of the single crystal sections 4 and the lattice network 3A is different, a chip slicing tool can be aligned readily along the scribe lines of the lattice network 3A, to provide an easy means of aligning and slicing the chips along the scribe lines, thereby improving the efficiency of production. For this reason, lattice network 3A is also referred to as a scribe network, indicative that the lattice network 3A serves more than one function. For simplicity, the term lattice network 3A is used in most cases, except when scribing is peripherally involved.

Expectations are increasing recently that the SOI technology can be applied not only to such commodity type ICs as DRAM (dynamic random access memory) and SRAM (static random access memory) ICs but also to custom ICs such as ASIC (application specific IC) and semi-custom ICs. Such IC chips are often made to specific standard sizes, therefore, the invented silicon wafer, having a preinstalled insulation layer 3 beneath the single crystal layer sections 4, would be useful for the manufacturing of a large variety of custom SOI ICs because they enable fabrication of custom isolation circuits by selective oxidation down to the preinstalled insulation layer 3.

Next, the process of manufacturing SOI wafers will be explained with reference to FIGS. 3 to 9.

First, as shown in FIG. 3, a mirror polished silicon wafer 10 (which ultimately becomes isolated single crystal sections 4) of a suitable resistivity is prepared. Photolithography is carried out by using a photomask having a chosen chip pattern and an alignment mark. This photomask contains only these chip patterns which can form a complete unit. Next, by means of etching, latticed grooves 11 of a depth $T_1$ are fabricated on the wafer body 10, except in the circumferential region. Also surface of the circumferential region is etched to the same depth as the latticed grooves 11.

In the next step, as shown in FIG. 4, by means of thermal and CVD oxidation process, the entire etched surface is oxidized to form insulation layer 3 of $SiO_2$. At the same time, inside surfaces of the latticed grooves 11 are oxidized to form the lattice network 3A. Also the circumferential region of the wafer body is oxidized to form the circumferential exposed region 3B. The region 3B is not subjected to IC component fabrication operations.

The choice of the dimensions of the rectangular area to be divided by the latticed grooves 11 is governed by the size of the IC to be manufactured or by standard chip dimensions. The height of the lattice network 3A is made equal to the thickness $T_1$ of the single crystal sections 4.

The total area represented by the sum of the areas of the lattice (scribe) network 3A and the exposed region 3B is limited to within 5 to 40% of the wafer surface area. If this figure is less than 5%, the lattice network 3A and the circumferential exposed region 3B do not serve the function of providing a stable stopper during polishing while if this figure is over 40%, there is a reduction in the active area of single crystal sections 4, which represents unnecessary cost penalty.

Next, as shown in FIG. 5, the spaces within the latticed grooves 11 are filled completely with polycrystalline silicon layer 12 by using such processes as CVD.

In the next processing step, the polycrystalline silicon layer 12 is reduced in thickness $T_3$ to form the polycrystalline silicon layer 2, as shown in FIG. 6, and polished to a mirror finish by means of such polishing means as mechano-chemical precision polishing. The thickness $T_3$ of this layer 2 is controlled to be over 1.0 micrometer. If this thickness $T_3$ is less than 1 micrometer, it is difficult to obtain the required flatness by subsequent polishing. The polished surface of the polycrystalline silicon layer 2 prepared as above is then placed face to face with a polished surface of another wafer 1, as shown in FIG. 7, and the two surfaces are joined by the technique of bonded wafer.

Next, the wafer 10 is ground to within 1 micrometer from the $SiO_2$ surfaces of the lattice network 3A and of the circumferential region 3B, and is finished to the final dimension by mechano-chemical polishing on a polishing disc.

At this stage of the processing, the circumferential edges of the wafer should be chamfered to prevent dust formation during subsequent processing.

The polishing solution used in conjunction with the above mentioned disc comprises solid particles of $SiO_2$ dispersed in an alkaline solution of pH 10 to 11. Thus, it is able to remove silicon but not $SiO_2$, which is a harder substance.

The polishing disc is made of a polished alumina or quartz having a series of intersecting surface grooves at 5 mm spacing. These grooves serve as drains for the polishing debris as well as retainers for the polishing grits. The width and the depth of the grooves are, respectively, 1.5 mm and 1.0 mm with a surface finish roughness of 1 micrometer.

Therefore, both the lattice network 3A of the insulation layer 3 and the circumferential exposed region 3B, which are composed of $SiO_2$, are not affected by mechano-chemical polishing step. The polishing process is automatically terminated when the lattice network 3A and the circumferential region 3B becomes exposed on the polishing surface of FIG. 8.

When this processing is completed, the single crystal sections 4 having the thickness $T_1$ are formed within the rectangular cavities 3C bounded by the lattice network 3A as shown in FIG. 8. In this case, by using the photomask described earlier, it becomes possible to form a wafer pattern which provides the maximum area of the circumferential exposed region 3B, which provides considerable peripheral support. As a result, it is possible to improve on the precision of the thickness of the single crystal layer sections 4 by improving on the precise timing for stopping the polishing operation.

The processed wafer is made into a final commercial product by applying those processes of washing, drying and other steps required for the usual IC wafer production.

According to this process of making SOI wafers, the single crystal layer thickness $T_1$ is accurately controlled because said thickness is dependent on the depth of the latticed grooves 11 which in turn is strictly controlled by photolithography and selective etching processes. For example, if the thickness $T_1$ of the single crystal sections 4 is 0.1 micrometer it is possible to control its variation within +0.02 to −0.02 micrometer. The quality of the single crystal sections 4 is high because the properties of this layer are the same as those of the single crystal wafer 10.

Furthermore, since the exposed circumferential region 3B is made of oxide, it provides considerable peripheral stopper function to determine the thickness of the single crystal sections 4 in the polishing process, thereby increasing the accuracy of dimensioning the thickness of the single crystal sections 4.

The inventors have fabricated many transistor elements in the single crystal sections 4 of the wafer produced by the above process. Said single crystal sections 4 were covered with a nitrided film, which was divided into 10 micrometer cells containing IC elements by means of photolithography.

This wafer was further subjected to selective oxidation at 1100° C. for fifteen minutes in a pyrogenic furnace to oxidize the latticed regions to reach to the insulation layer 3.

It was confirmed, by sectioning and examining at high magnifications, that transistors conforming to the SOI architecture were fabricated within each of the cells of 10 micrometer square by 0.1 micrometer depth. Individual transistors were tested electrically and they were found to meet expected performance requirements.

It should be noted that the invented silicon wafers above are not limited to the cases described above. Other suitable arrangements of deposits and layers as well as fabrication sequences can be adapted while basically adhering to the methodology described in this invention.

Figure 9:
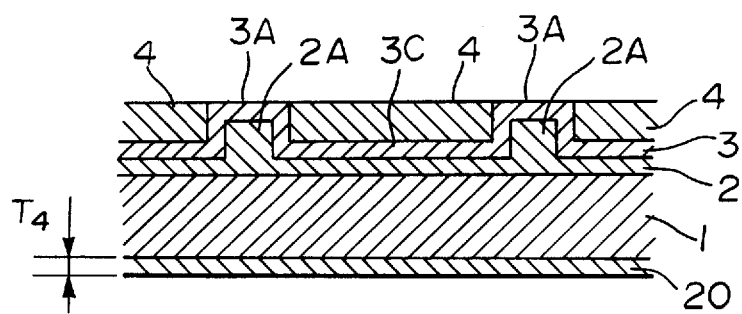
FIG. 9 presents a cross sectional view of another preferred embodiment of this invention.

For example, FIG. 9 presents a second preferred embodiment of this invention. This wafer has a compensating structural layer 20 to modify the effects of thermal stresses generated during the various heat treatment cycles of IC fabrication operations. The material and its thickness of the compensating layer 20 are chosen so as to equalize the generated thermal stresses of the top and the bottom surfaces of the wafer. The compensating layer 20 can be made of the same material as the insulation layer 3, in this case $SiO_2$. The thickness $T_4$ of this insulation layer 20 is substantially the same as the thickness $T_2$ of the chip separating structure 2.

By providing the layer 20 with the same material on both the top and the bottom surfaces of the wafer, it becomes possible to equalize the degree of thermal expansion to prevent warping of the wafer, caused by unbalanced thermal expansion forces, during heating and cooling of the wafer.

In this invention, it should be noted that the material for the insulation layer 3 need not be limited to $SiO_2$ but other substances offering similar insulating qualities, such as $Si_3N_4$, can be substituted. In the above example, although the lattice network 3A of the insulation layer (chip separating structure) 3 was constructed of the same materials as that disposed opposite to the rectangular spaces 3C, it can also be made of a different material. Also the lattice network 3A does not need to be made of an electrically insulating material, an electrically conductive material can be used. Another variation of the invented wafer would be a wafer having no circumferential exposed region 3B.

What is claimed is:

1. A method of manufacturing a silicon wafer structure, comprising:

providing a first silicon wafer having a first polished surface;

etching said first polished surface of a first silicon wafer to a depth T1 so as to form a latticed groove network and a circumferential recessed region in said first silicon wafer, said circumferential recessed region encompassing an entirety of an edge of said first silicon wafer so as to surround said latticed groove network, said latticed groove network and said circumferential recessed region being etched to said depth T1, wherein a total area of said latticed groove network and said circumferential recessed region occupies between 5%–40% of a total surface area of said silicon wafer;

forming an insulating layer, made of one of silicon nitride and silicon dioxide, on said etched first surface of said first silicon wafer so that an entirety of said insulating layer has a substantially uniform height T2 from an upper surface thereof to a lower surface adjacent said etched first surface of said first silicon wafer, to provide a chip separating structure having a lattice network portion and a circumferential portion surrounding said lattice network portion;

forming a polycrystalline silicon layer on said insulating layer so that said polycrystalline silicon layer fills in grooves defined in said lattice network portion and fills in said circumferential portion and polishing said polycrystalline silicon layer to provide a flat mirror surface for said first silicon wafer, wherein a distance T3 between said flat mirror surface and said upper surface of said insulating layer is greater than 1.0 µm;

bonding a second silicon wafer to said flat mirror surface of said first silicon wafer;

grinding a surface of said first silicon wafer opposite said etched first surface to within 1 µm of a surface of said circumferential portion and said lattice network portion of said chip separating structure;

mechano-chemically polishing a surface of said first silicon wafer opposite said etched first surface using a polishing machine until said polishing machine is brought into contact with said circumferential portion and said lattice network portion of said chip separating structure so that a plurality of single crystal layer sections are formed in cavities defined in said insulation layer of said chip separating structure, wherein said circumferential portion cooperates with said lattice network to provide said single crystal layer sections with a mirror finish having said thickness T1 by stopping said mechano-chemically polishing step at a top of said insulating layers, said single crystal layer sections being isolated from one another by said lattice network, wherein a uniform thickness of said single crystal layer sections is identified by recognizing interference colors of said single crystal layer sections, and wherein a polishing disk used in said polishing step is made of one of polished alumina and quartz with a surface finish roughness of 1.0 micron and has a series of intersecting surface grooves defined therein at a 5 mm spacing, each groove having a width of 1.5 mm and a depth of 1.0 mm; and chamfering circumferential edges of said silicon wafer.

2. A method of manufacturing a silicon wafer structure according to claim 1, wherein said thickness T2 for said insulation layer, excepting said latticed groove network is not less than 0.1 micrometer and not more than 2.0 micrometer.

3. A method of manufacturing a silicon wafer structure according to claim 1, wherein said plurality of single crystal layer sections are square and are separated from one another by a width of said lattice network such that said width of said lattice network between adjacent single crystal layer sections is more than 0.2 mm and less than 2.0 mm, in order to facilitate separating the single crystal layer sections into chips along a line of an edge of said lattice network having different coloring from a line of an edge of said single crystal layer sections.

4. A method of manufacturing a silicon wafer structure according to claim 1, wherein said plurality of single crystal layer sections are rectangular and said thickness T1 for said latticed groove network and said circumferential recessed region is in a range 0.05 to 0.2 micrometers such that a thickness uniformity of said single crystal layer sections is inspected by recognizing interference colors of said single crystal layer sections.

5. A method of manufacturing a silicon wafer structure according to claim 1, wherein said insulation layer of said chip separating structure is formed such that each of said plurality of single crystal layer sections has dimensions ranging from not less than 1 mm to not more than 20 mm in order to distinguish said insulating layer from said single crystal layer sections by color.

* * * * *